United States Patent
Kim et al.

(10) Patent No.: US 11,854,948 B2
(45) Date of Patent: Dec. 26, 2023

(54) SEMICONDUCTOR PACKAGE

(71) Applicant: SAMSUNG ELECTRONICS CO., LTD., Suwon-si (KR)

(72) Inventors: Byungho Kim, Cheonan-si (KR); Seongjin Shin, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/195,774

(22) Filed: Mar. 9, 2021

(65) Prior Publication Data
US 2022/0059437 A1 Feb. 24, 2022

(30) Foreign Application Priority Data

Aug. 19, 2020 (KR) .................. 10-2020-0103753

(51) Int. Cl.
*H01L 23/31* (2006.01)
*H01L 23/495* (2006.01)
*H01L 23/00* (2006.01)
*H01L 23/538* (2006.01)
*H01L 25/065* (2023.01)

(52) U.S. Cl.
CPC .......... *H01L 23/4952* (2013.01); *H01L 23/31* (2013.01); *H01L 23/5384* (2013.01); *H01L 23/5386* (2013.01); *H01L 24/14* (2013.01); *H01L 25/0657* (2013.01)

(58) Field of Classification Search
CPC ............. H01L 23/4952; H01L 23/5384; H01L 23/5386; H01L 24/14; H01L 25/0657
See application file for complete search history.

(56) References Cited

U.S. PATENT DOCUMENTS

| | | |
|---|---|---|
| 5,409,157 A | 4/1995 | Nagesh et al. |
| 6,169,022 B1 | 1/2001 | Saitou |
| 7,180,183 B2 | 2/2007 | Tsai et al. |
| 7,576,438 B2 | 8/2009 | Jung et al. |
| 10,117,336 B2 | 10/2018 | Kaneko et al. |
| 2006/0038291 A1 | 2/2006 | Chung et al. |
| 2007/0298546 A1 | 12/2007 | Lee et al. |

(Continued)

FOREIGN PATENT DOCUMENTS

| | | |
|---|---|---|
| JP | 3942952 B2 | 7/2007 |
| JP | 2008-016460 A | 1/2008 |
| KR | 10-2006-0016217 A | 2/2006 |

*Primary Examiner* — Trang Q Tran
(74) *Attorney, Agent, or Firm* — Sughrue Mion, PLLC

(57) ABSTRACT

A semiconductor package includes a package substrate including a redistribution layer; a semiconductor chip disposed on the package substrate and electrically connected to the redistribution layer; a wiring structure disposed on the semiconductor chip and having an upper surface on which pads are arranged; a vertical connection structure disposed between the package substrate and the wiring structure and electrically connecting the redistribution layer and the pads; and a passivation layer disposed on the wiring structure and having openings partially exposing a region of each of the pads. The pads include a first pad adjacent to a corner of the wiring structure, and a second pad closer to a center of the wiring structure than the first pad. A first width of the first pad is greater than a second width of the second pad. A contact layer is disposed in the opening on the first pad.

17 Claims, 10 Drawing Sheets

(56) References Cited

U.S. PATENT DOCUMENTS

| | | | |
|---|---|---|---|
| 2012/0326286 A1* | 12/2012 | Camacho | H01L 23/49861 |
| | | | 257/676 |
| 2014/0203397 A1* | 7/2014 | Yen | H01L 21/76885 |
| | | | 438/381 |
| 2019/0244905 A1* | 8/2019 | Yu | H01L 24/19 |
| 2020/0135679 A1* | 4/2020 | Darmawaikarta | |
| | | | H01L 21/76877 |
| 2020/0364600 A1* | 11/2020 | Elsherbini | H01L 29/66439 |

\* cited by examiner

I-I'

A

B

A

B

SEMICONDUCTOR PACKAGE

CROSS-REFERENCE TO RELATED APPLICATION(S)

This application claims the benefit under 35 USC 119(a) of Korean Patent Application No. 10-2020-0103753 filed on Aug. 19, 2020 in the Korean Intellectual Property Office, the entire disclosure of which is incorporated by reference herein in its entirety.

BACKGROUND

1. Field

The present disclosure relates to a semiconductor package.

2. Description of Related Art

Semiconductor devices require high-capacity data processing while the volume thereof is becoming smaller. Accordingly, to apply a package-on-package (POP) of a semiconductor package including different semiconductor chips, a pad connected to an upper package is formed on an upper surface of a lower package, thereby forming a connection bump connecting the lower package and the upper package to each other.

SUMMARY

It is an aspect to provide a semiconductor package having improved reliability.

According to an aspect of one or more example embodiments, there is provided a semiconductor package includes a first semiconductor package including a first package substrate including a redistribution layer, a first semiconductor chip disposed on the first package substrate and electrically connected to the redistribution layer, a molded member disposed on the first package substrate and covering the first package substrate and the first semiconductor chip, a wiring structure disposed on the molded member and having an upper surface on which a plurality of upper pads are arranged, and a frame disposed between the first package substrate and the wiring structure, having a through-hole in which the first semiconductor chip is disposed, the frame electrically connecting the redistribution layer and the plurality of upper pads; a second semiconductor package disposed on the first semiconductor package, and including a second package substrate having a lower surface on which a plurality of lower redistribution pads are arranged, and a second semiconductor chip disposed on the second package substrate and electrically connected to the plurality of lower redistribution pads; and a plurality of connection bumps electrically connecting the plurality of upper pads and the plurality of lower redistribution pads. The plurality of upper pads include a first upper pad adjacent to a corner of the upper surface of the wiring structure, and a second upper pad closer to a center of the upper surface of the wiring structure than the first upper pad, the plurality of connection bumps include a first connection bump disposed in a position corresponding to the first upper pad and a second connection bump disposed in a position corresponding to the second upper pad, a first width of the first upper pad is greater than a second width of the second upper pad, a maximum width of the first connection bump is greater than a maximum width of the second connection bump, and the wiring structure further includes a contact layer disposed on the first upper pad between the first upper pad and the first connection bump.

According to another aspect of one or more example embodiments, there is provided a semiconductor package includes a package substrate including a redistribution layer; a semiconductor chip disposed on the package substrate and electrically connected to the redistribution layer; a wiring structure disposed on the semiconductor chip, the wiring structure having an upper surface on which a plurality of pads are arranged; a vertical connection structure disposed between the package substrate and the wiring structure and electrically connecting the redistribution layer and the plurality of pads; and a passivation layer disposed on the wiring structure and having a plurality of openings at least partially exposing a region of each of the plurality of pads. The plurality of pads include a first pad adjacent to a corner of an upper surface of the wiring structure, and a second pad closer to a center of the upper surface of the wiring structure than the first pad, a first width of the first pad is greater than a second width of the second pad, and the semiconductor package further includes a contact layer disposed on the first pad in an opening of the plurality of openings that at least partially exposes the region of the first pad.

According to yet another aspect of one or more example embodiments, there is provided a semiconductor package includes a first semiconductor package; a second semiconductor package disposed on the first semiconductor package; and a plurality of connection bumps electrically connecting the first and second semiconductor packages. The first semiconductor package includes a first package substrate including a redistribution layer, a first semiconductor chip disposed on the first package substrate and electrically connected to the redistribution layer, a wiring structure disposed on the semiconductor chip and having an upper surface on which a plurality of upper pads are arranged, and a vertical connection structure disposed on the first package substrate and electrically connecting the redistribution layer and the plurality of upper pads, the second semiconductor package includes a second package substrate having a lower surface on which a plurality of lower redistribution pads are arranged, and a second semiconductor chip disposed on the second semiconductor package and electrically connected to the plurality of lower redistribution pads, the plurality of connection bumps include a first connection bump that is at least a portion of outermost connection bumps arranged along edges of the wiring structure and the second package substrate, and a second connection bump, other than the first connection bump, and a first thickness of the first connection bump in a vertical direction on the wiring structure is less than a second thickness of the second connection bump.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, example embodiments will be described with reference to the accompanying drawings.

Figure 1:
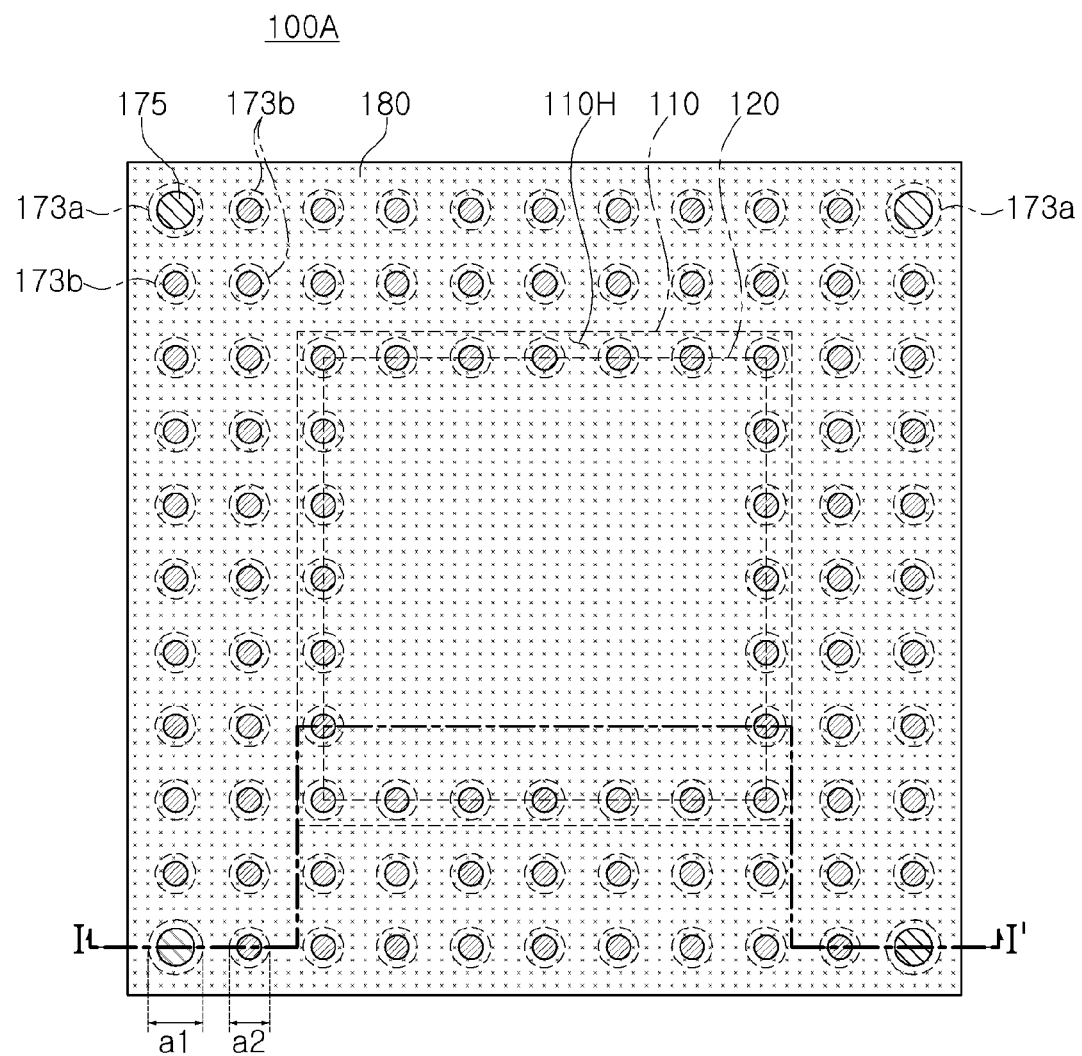
FIG. 1 is a schematic plan view of a semiconductor package according to example embodiments.
Figure 2:
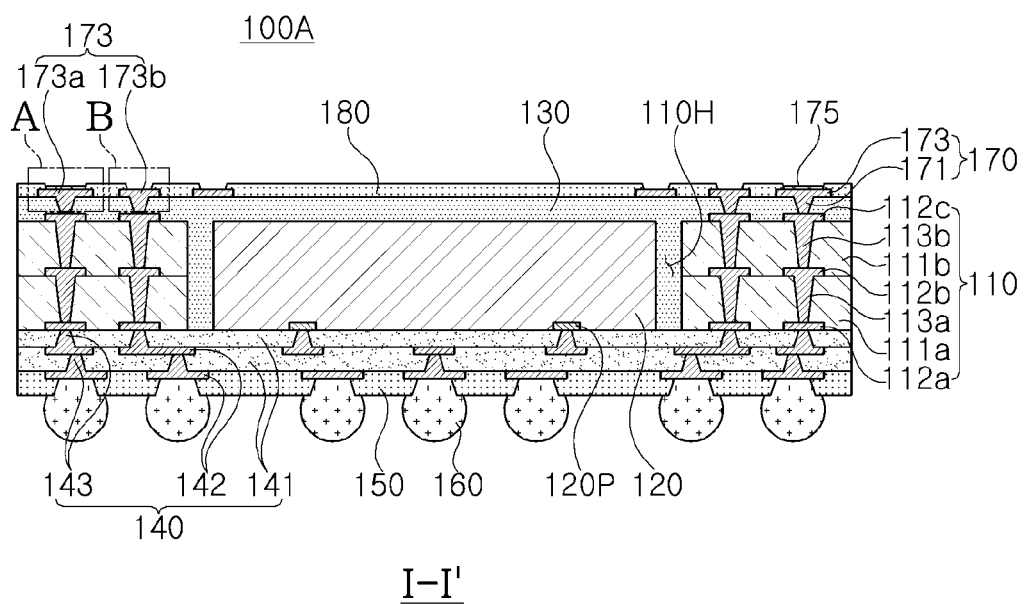
FIG. 2 is a schematic cross-sectional view of the semiconductor package of FIG. 1, according to example embodiments.
Figure 3A:
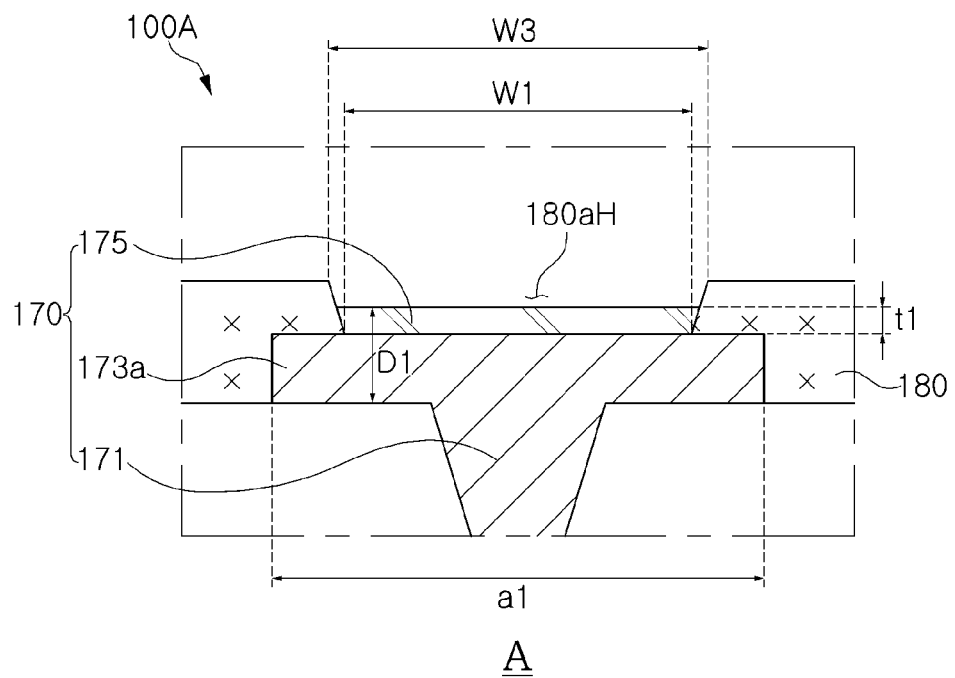
FIGS. 3A and 3B are schematic partially enlarged views of the semiconductor package of FIG. 2, according to example embodiments.
Figure 3B:
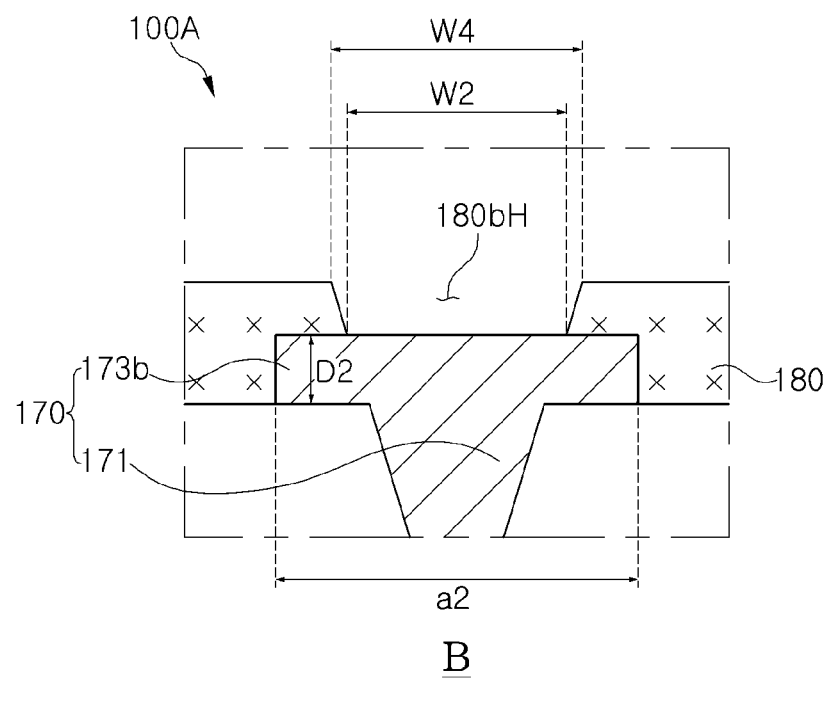

FIG. 1 is a schematic plan view of a semiconductor package according to example embodiments. FIG. 1 is a plan view as viewed from the top of a first semiconductor package 100A. FIG. 2 is a schematic cross-sectional view of the semiconductor package of FIG. 1, according to example embodiments. FIG. 2 is a cross-sectional view illustrating an area taken along line I-I" of FIG. 1. FIGS. 3A and 3B are partially enlarged views of the semiconductor package of FIG. 2, according to example embodiments. FIG. 3A is an enlarged view of area "A" of FIG. 2. FIG. 3B is an enlarged view of area 13' of FIG. 2.

Referring to FIGS. 1 to 3B, a first semiconductor package 100A may include a vertical connection structure 110, a first semiconductor chip 120, a molded member 130, a first package substrate 140 including a redistribution layer 142, and a wiring structure 170 that includes a plurality of upper pads 173 and a contact layer 175 disposed on at least a portion of the plurality of upper pads 173. In an example embodiment, the first semiconductor package 100A may include a second passivation layer 180 covering a portion of the wiring structure 170.

In an example embodiment, the first semiconductor package 100A may further include a first passivation layer 150 disposed on the first package substrate 140 and protecting the redistribution layer 142, and a first metal bump 160 disposed on the first passivation layer 150.

The vertical connection structure 110 is disposed on one surface of the first package substrate 140 and electrically connects the redistribution layer 142 and the plurality of upper pads 173. For example, the vertical connection structure 110 may electrically connect the redistribution layer 142 and the plurality of upper pads 173 by penetrating through at least a portion of the molded member 130. The vertical connection structure 110 may be directly disposed on the upper surface of the first package substrate 140. The vertical connection structure 110 may be disposed between the first package substrate 140 and the wiring structure 170. The vertical connection structure 110 may be a frame including a plurality of insulating layers 111a and 111b, a plurality of wiring layers 112a and 112b, and a plurality of wiring vias 113a and 113b. The frame may include a first insulating layer 111a in contact with the first package substrate 140, a first wiring layer 112a in contact with the first package substrate 140 and buried in the first insulating layer 111a, a second wiring layer 112b disposed on the opposite side of a side of the first insulating layer 111a in which the first wiring layer 112a is buried, a second insulating layer 111b disposed on the first insulating layer 111a and covering the second wiring layer 112b, and a third wiring layer 112c disposed on the opposite side of a side of the second insulating layer 111b in which the second wiring layer 112b is buried. The first to third wiring layers 112a, 112b and 112c may be electrically connected to the redistribution layer 142. The first wiring via 113a may penetrate through the first insulating layer 111a and may electrically connect the first wiring layer 112a and the second wiring layer 112b. The second wiring via 113b may penetrate through the second insulating layer 111b and may electrically connect the second wiring layer 112b and the third wiring layer 112c.

The vertical connection structure 110 may further improve the rigidity of the semiconductor package according to a material of the insulating layers 111a and 111b, and may secure uniform thickness of the molded member 130. The vertical connection structure 110 may have a through-hole 110H penetrating through the insulating layers 111a and 111b. The first semiconductor chip 120 may be disposed in the through-hole 110H. For example, the through-hole 110H may accommodate the first semiconductor chip 120 therein. In some example embodiments, the through-hole 110H may have a wall surface surrounding the first semiconductor chip 120, but the configuration is not limited thereto.

A material of the insulating layers 111a and 111b of the vertical connection structure 110 is not particularly limited. For example, an insulating material may be used. In this case, as the insulating material, a thermosetting resin such as an epoxy resin, a thermoplastic resin such as polyimide, or a resin in which these resins are mixed with an inorganic filler, for example, Ajinomoto Build-up Film (ABF), or the like may be used. Alternatively, a material in which the above-described resin may be impregnated in glass fibers (Glass Fiber, Glass Cloth, Glass Fabric) together with an inorganic filler, for example, a prepreg may be used.

The wiring layers 112a, 112b and 112c may provide an upper/lower electrical connection path of the first semiconductor package 100A together with the wiring vias 113a and 113b, and may serve as a structure that redistributes the connection pad 120P. The wiring layers 112a, 112b and 112c may include copper (Cu), aluminum (Al), silver (Ag), tin (Sn), gold (Au), nickel (Ni), lead (Pb), titanium (Ti), or alloys thereof. The wiring layers 112a, 112b and 112c may include a ground (GrouND: GND) pattern, a power (PoWeR: PWR) pattern, and a signal pattern depending on the corresponding layer. The signal pattern may include various signals, for example, data signals, excluding a ground (GND) pattern, a power (PWR) pattern, and the like. In some example embodiments, the ground (GND) pattern and the power (PWR) pattern may be the same pattern. In addition, the wiring layers 112a, 112b and 112c may respectively include various types of via pads. The wiring layers 112a, 112b and 112c may be formed by a known plating process, and may be each formed of a seed layer and a conductor layer.

The wiring vias 113a and 113b electrically connect the wiring layers 112a, 112b and 112c formed on different layers, and as a result, an electrical path may be formed in the vertical connection structure 110. The wiring vias 113a and 113b may include copper (Cu), aluminum (Al), silver (Ag), tin (Sn), gold (Au), nickel (Ni), lead (Pb), titanium (Ti), or alloys thereof. The wiring vias 113a and 113b may include a signal via, a power via, and a ground via, and in some example embodiments the power via and the ground via may be the same via. The wiring vias 113a and 113b may be filled-type vias filled with a metallic material, or may be conformal-type vias in which a metallic material is formed along a wall surface of the via hole. The wiring vias 113a and 113b may be formed by a plating process, and may be formed of a seed layer and a conductor layer.

The first semiconductor chip 120 may be disposed on the first package substrate 140. The first semiconductor chip 120 may be electrically connected to the redistribution layer 142. The first semiconductor chip 120 may have an active surface on which the connection pads 120P are disposed, and an inactive surface that is opposite to the active surface. The first semiconductor chip 120 may be a logic chip or a memory chip. For example, the first semiconductor chip 120 may include a Large scale integration (LSI), a logic circuit, a CMOS imaging sensor (CIS), a memory device such as DRAM, SRAM, flash, PRAM, ReRAM, FeRAM, MRAM, High bandwidth memory (HBM), Hybrid memory cubic (HMC) or the like, Microelectromechanical System (MEMS) device, or the like. Separate connection members may be disposed between the connection pads 120P and the redistribution layer 142. In some example embodiments, the connection members may include a solder ball or a copper pillar. For example, the first semiconductor chip 120 may be mounted on the first package substrate 140 in a flip-chip bonding method. In this case, an underfill resin surrounding the connection members may be formed between the first semiconductor chip 120 and the first package substrate 140.

The molded member 130 is disposed on the first package substrate 140 and may cover at least portions of the vertical connection structure 110 and the first semiconductor chip 120. The molded member 130 may include an insulating material, and as the insulating material, a material including an inorganic filler and an insulating resin, for example, a thermosetting resin such as an epoxy resin, a thermoplastic resin such as polyimide, or a resin in which these resins are mixed with a reinforcing material such as an inorganic filler, in detail, ABF, FR-4, BT, resin, or the like may be used. In addition, a molding material such as EMC or a photosensitive material such as Photo Imageable Encapsulant (PIE) may also be used.

The first package substrate 140 may include an insulating layer 141, the redistribution layer 142 disposed on the insulating layer 141, and redistribution vias 143 penetrating through the insulating layer 141 and electrically connecting the redistribution layer 142, the vertical connection structure 110 and the connection pads 120P of the first semiconductor chip 120. The first package substrate 140 may redistribute the connection pads 120P of the first semiconductor chip 120 to a fan-out area, and may physically and/or electrically connect the connection pads 120P externally through the first metal bump 160. The number of the insulating layers 141, the redistribution layers 142, and the redistribution vias 143 may be greater or less than those illustrated in the drawings.

The insulating layer 141 of the first package substrate 140 may include an insulating material. For example, a photo-imageable dielectric (PID) material may be used as the insulating material, and in this case, a fine pitch may be implemented through a photo via. The boundary of the insulating layers 141 of the first package substrate 140 may be distinguished, or may be unclear.

The redistribution layer 142 may redistribute the connection pads 120P of the first semiconductor chip 120 to be electrically connected to the vertical connection structure 110 and the first metal bump 160. For example, the redistribution layer 142 may include a connection pattern portion electrically connecting the connection pad 120P. The redistribution layers 142 may be connected to each other via an area not illustrated in the drawing.

The redistribution layer 142 may include copper (Cu), aluminum (Al), silver (Ag), tin (Sn), gold (Au), nickel (Ni), lead (Pb), titanium (Ti), or alloys thereof. The redistribution layer 142 may perform various functions according to a design. For example, the redistribution layer 142 may include a ground (GND) pattern, a power (PWR) pattern, a signal pattern, and the like. In some example embodiments, the ground (GND) pattern and the power (PWR) pattern may be the same pattern. In addition, the redistribution layer 142 may include a redistribution via pad and a connection bump pad. The redistribution layer 142 may be formed through a plating process, and may include a seed layer and a conductor layer.

The redistribution vias 143 may electrically connect the redistribution layers 142 formed on different layers. The redistribution vias 143 may electrically connect the connection pad 120P of the first semiconductor chip 120 and the vertical connection structure 110 to the redistribution layer 142. The redistribution vias 143 may physically contact the connection pad 120P in example embodiments in which the first semiconductor chip 120 is a bare die.

The redistribution vias 143 may include copper (Cu), aluminum (Al), silver (Ag), tin (Sn), gold (Au), nickel (Ni), lead (Pb), titanium (Ti), or alloys thereof. The redistribution vias 113 may include a signal via, a power via, a ground via, and the like, and in some example embodiments, the power via and the ground via may be the same via. The redistribution vias 113 may be filled-type vias filled with a metallic material, or may be conformal-type vias in which a metallic material is formed along a wall surface of the via hole. The redistribution vias 143 may be formed through a plating process, and may be formed of a seed layer and a conductor layer.

The first passivation layer 150 is configured to protect the first package substrate 140 from physical and chemical damage. The first passivation layer 150 may include a thermosetting resin. In some example embodiments, the first passivation layer 150 may include, for example, ABF, but the configuration thereof is not limited thereto. For example, in some example embodiments, the first passivation layer 150 and may include other types of insulating materials. The first passivation layer 150 may have an opening that exposes at least a portion of a lowermost redistribution layer 142 among the redistribution layers 142. In some embodiments, the opening may be tens of openings to tens of thousands of openings, and in other example embodiments may have a number of openings more or less than tens to tens of thousands. In some example embodiments, each opening may be formed of a plurality of holes.

The first metal bump 160 may be formed in an opening of the first passivation layer 150 to be electrically connected to an exposed lowermost redistribution layer 142.

The first metal bump 160 is a component for physically and/or electrically connecting the first semiconductor package 100A externally. For example, the first semiconductor package 100A may be mounted on a main board of an electronic device through the first metal bump 160. The first metal bump 160 may be disposed on the first passivation layer 150. The first metal bump 160 may be formed of a low melting point metal, for example, tin (Sn) or an alloy including tin (Sn). In some example embodiments, the first metal bump 160 may include solder, but the material is not particularly limited.

The first metal bump 160 may be a land, a ball, a pin, or the like. The first metal bump 160 may be formed of a multilayer or a single layer. When the first metal bump 160 is formed of multiple layers, the first metal bump 160 may include a copper pillar and solder, and when formed as a single layer, tin-silver solder or copper may be included, but example embodiments are not limited thereto. The number, spacing, arrangement shape, and the like of the first metal bumps 160 are not particularly limited, and in various example embodiments may be sufficiently modified.

At least one of the first metal bumps 160 may be disposed in the fan-out area. The fan-out area refers to a region outside of the region in which the first semiconductor chip 120 is disposed. A fan-out package is more reliable than a fan-in package, may implement multiple I/O terminals, and facilitates 3D interconnection. In addition, compared to a Ball Grid Array (BGA) package and a Land Grid Array (LGA) package, the package thickness of the fan-out package may be relatively reduced, and the price competitiveness is excellent.

The wiring structure 170 may be disposed on the upper surface of the molded member 130. The wiring structure 170 may include a plurality of vertical connection vias 171 penetrating through a portion of the molded member 130, and a plurality of upper pads 173 disposed on the vertical connection vias 171, respectively. The wiring structure 170 may include an upper surface on which a plurality of upper pads 173 are arranged. In an example embodiment, the wiring structure 170 may further include a contact layer 175 disposed on a first upper pad 173a adjacent to a corner of the upper surface of the wiring structure 170, among the plurality of upper pads 173. For example, in some example embodiments, the contact layer 175 may be disposed only on first upper pads 173a disposed in four corners of the first semiconductor package 100A.

The vertical connection vias 171 are disposed on the vertical connection structure 110 and may be electrically connected to the vertical connection structure 110. The vertical connection vias 171 may be disposed on an uppermost third wiring layer 112c among the wiring layers. The wiring structure 170 includes a line-shaped redistribution pattern connected to the connection vias 171 that is connected to the third wiring layer 112c, and a partial region (mainly an end portion) of the redistribution pattern may be provided as the plurality of upper pads 173. The vertical connection vias 171 may be formed by a plating process together with a redistribution pattern, and in some example embodiments may include a seed layer and a conductor layer.

The plurality of upper pads 173 may be electrically connected to the vertical connection structure 110 through the vertical connection vias 171. A partial region of the plurality of upper pads 173 may be covered by the second passivation layer 180 disposed on the molded member 130. The redistribution pattern having the plurality of upper pads 173 may provide a redistribution circuit on one surface of the first semiconductor package 100A. The redistribution pattern and the plurality of upper pads 173 may include a conductive material. For example, the conductive material may include copper (Cu), aluminum (Al), silver (Ag), tin (Sn), gold (Au), nickel (Ni), lead (Pb), titanium (Ti), or alloys thereof. The redistribution pattern and the plurality of upper pads 173 may perform various functions, and for example, may include a ground (GND) pattern, a power (PWR) pattern, or a signal pattern.

The plurality of upper pads 173 may include a first upper pad 173a adjacent to a corner of the upper surface of the wiring structure 170, and a second upper pad 173b closer to the center of the upper surface of the wiring structure 170 than the first upper pad 173a. In some example embodiments, the first upper pads 173a may be disposed adjacent to corners of the upper surface of the wiring structure 170, and the second upper pads 173b may be disposed between the first upper pads 173a. In other example embodiments, the first upper pads 173a may be at least a portion of outermost upper pads 173 arranged along the edge of the upper surface of the wiring structure 170, and the second upper pads 173b may be disposed further inside than the first upper pads 173a. As illustrated in FIG. 1, the first upper pads 173a may be upper pads disposed at corners, among outermost upper pads 173 arranged along the edge of the upper surface of the wiring structure 170, and the second upper pads 173b may be upper pads except for the first upper pads 173a, among the plurality of upper pads 173. In some example embodiments, the first upper pads 173a may be disposed on the outermost side of the wiring structure 170, and the second upper pads 173b may be adjacent to the first upper pads 173a.

A first width a1 of the first upper pad 173a may be wider than a second width a2 of the second upper pad 173b, as illustrated in FIG. 1. In an example embodiment, the first width a1 of the first upper pad 173a may be about 5% to about 10% wider than the second width a2 of the second upper pad 173b. In an example embodiment, the first width a1 of the first upper pad 173a may be about 10 μm to about 40 μm wider than the second width a2 of the second upper pad 173b. In an example embodiment, the first width a1 of the first upper pad 173a may range from about 250 μm to about 270 μm. In an example embodiment, the second width a2 of the second upper pad 173b may range from about 230 μm to about 250 μm. When the first width a1 of the first upper pad 173a is wider than the second width a2 of the second upper pad 173b, a package-on-package (POP) between the first semiconductor package 100A and another semiconductor package may increase connection reliability.

The contact layer 175 may be disposed on the first upper pad 173a. The contact layer 175 may be disposed in a first opening 180aH of the second passivation layer 180 covering a partial area of the first upper pad 173a (see FIG. 3A). In some example embodiments, the distance D1 from the lower surface of the first upper pad 173a to the upper surface of the contact layer 175 may be greater than a distance D2 from the lower surface of the second upper pad 173b to the upper surface of the second upper pad 173b. In an example embodiment, the upper surface of the contact layer 175 may be disposed at a lower level than the upper surface of the second passivation layer 180. The side surface of the contact layer 175 may be surrounded by the second passivation layer 180. The contact layer 175 may not be disposed on the second upper pad 173b. The contact layer 175 may include a low melting point metal, for example, tin (Sn) or an alloy (Sn—Ag—Cu) including tin (Sn). A thickness t1 of the contact layer 175 in the vertical direction on the first package substrate 140 may range from about 5 μm to about 15 μm.

The second passivation layer 180 may be disposed on the wiring structure 170. The second passivation layer 180 may be disposed on the molded member 130. The second passivation layer 180 may have an opening that exposes at least a portion of the wiring structure 170. In an example embodiment, the opening may have lower and upper widths different from each other. In an example embodiment, a width of an upper portion of the opening may be wider than a width of a lower portion of the opening. For example, in some example embodiments, W3>W1 and W4>W2. The second passivation layer 180 may cover a partial region of each of the plurality of upper pads 173. The second passivation layer 180 may cover a side surface and a portion of an upper surface of each of the plurality of upper pads 173.

The second passivation layer 180 is a component for protecting the wiring structure 170 from physical and chemical damage. In some example embodiments, the second passivation layer 180 may include a thermosetting resin, for example, ABF, but the material is not limited thereto. In some example embodiments, the opening may be provided as tens to tens of thousands of openings.

The opening of the second passivation layer 180 may include a first opening 180aH at least partially exposing a region of the first upper pad 173a, and a second opening 180bH at least partially exposing a region of the second upper pad 173b. For example, the second passivation layer 180 surrounding a portion of the upper surface and a side surface of the first upper pad 173a may have the first opening 180aH, and the second passivation layer 180 surrounding a portion of the upper surface and a side surface of the second upper pad 173b may have the second opening 180bH.

In some example embodiments, a first width, which may be an average width of the first opening 180aH, may be wider than the second width, which may be an average width of the second opening 180bH. In other words, in some example embodiments, the average of W1 and W3 of a single first opening 180aH may be greater than the average of W2 and W4 of a single second opening 180bH. In an example embodiment, the first width of the first upper pad 173a may be about 5% to about 10% wider than the second width of the second upper pad 173b. A width W1 of a lowermost portion of the first opening 180aH may be wider than a width W2 of a lowermost portion of the second opening 180bH. A width W3 of an uppermost portion of the first opening 180aH may be wider than a width W4 of an uppermost portion of the second opening 180bH. Accordingly, the first upper pad 173a may have a larger area of a region exposed by the second passivation layer 180 than that of the second upper pad 173b. In other example embodiment, the first width, which may be an the average width of the plurality of first openings 180aH, may be about 10 μm to about 40 μm wider than the second width, which may be an average width of the plurality of second openings 180bH. In other words, in other example embodiments, the average width of the plurality of first openings 180aH in the first semiconductor package 100A may be greater than the average width of the plurality of second openings 180bH in the first semiconductor package 100A. In an example embodiment, the width W1 of the lowermost portion of the first opening 180aH may be in the range of about 225 μm to about 245 μm, and the width W2 of the lowermost portion of the second opening 180bH may range from about 205 μm to about 220 μm. The width W3 of the uppermost portion of the first opening may range from about 240 μm to about 260 μm, and the width W4 of the uppermost portion of the second opening may range from about 220 μm to about 240 μm.

Figure 4A:
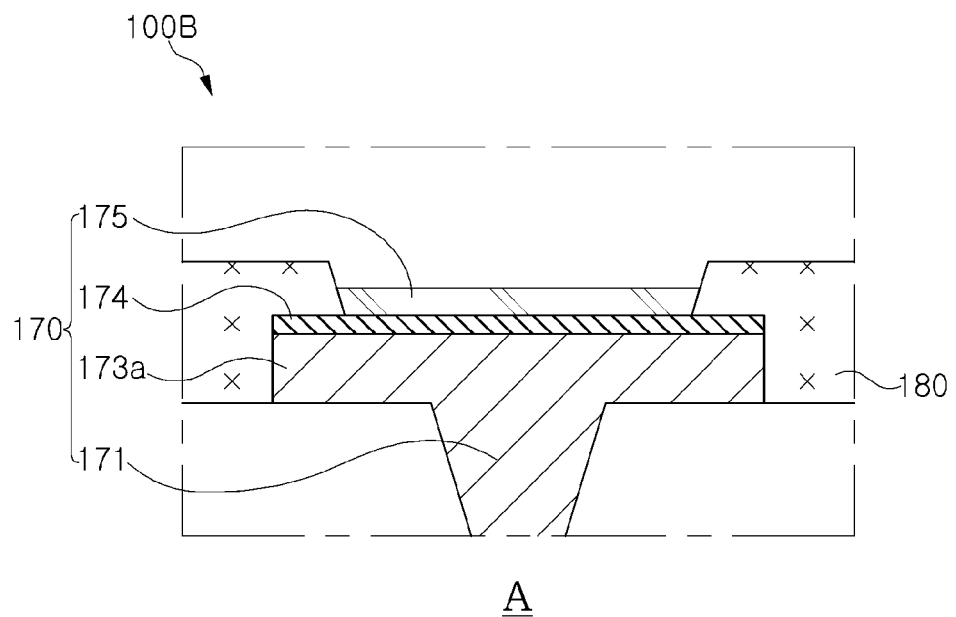
FIGS. 4A and 4B are schematic partially enlarged views of the semiconductor package according to example embodiments.
Figure 4B:
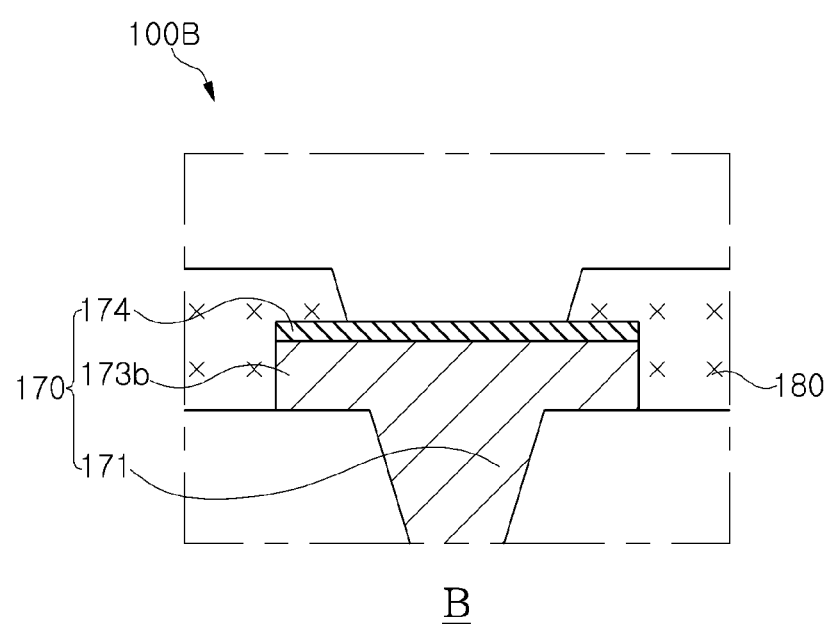

FIGS. 4A and 4B are schematic partially enlarged views of a semiconductor package according to example embodiments.

Referring to FIGS. 4A and 4B, in a semiconductor package 100B, the wiring structure 170 may further include a barrier layer 174 disposed on the upper pads 173. The width of the barrier layer 174 is illustrated to be the same as the upper pads 173, but is not limited thereto, and in some example embodiment, the width of the barrier layer 174 may be less than that of the upper pads 173, for example.

The barrier layer 174 may be disposed between the first upper pad 173a and the contact layer 175. The barrier layer 174 disposed on the second upper pad 173b may have an upper surface exposed by the passivation layer 180. In an example embodiment, the barrier layer 174 may be formed of a material different from the material of the upper pads 173. The barrier layer 174 may be formed of, for example, nickel (Ni) or gold (Au). In an example embodiment, the barrier layer 174 may be a single layer including nickel (Ni) or a multilayer including nickel (Ni) and gold (Au). The barrier layer 174 may be formed through a plating process.

Figure 5:
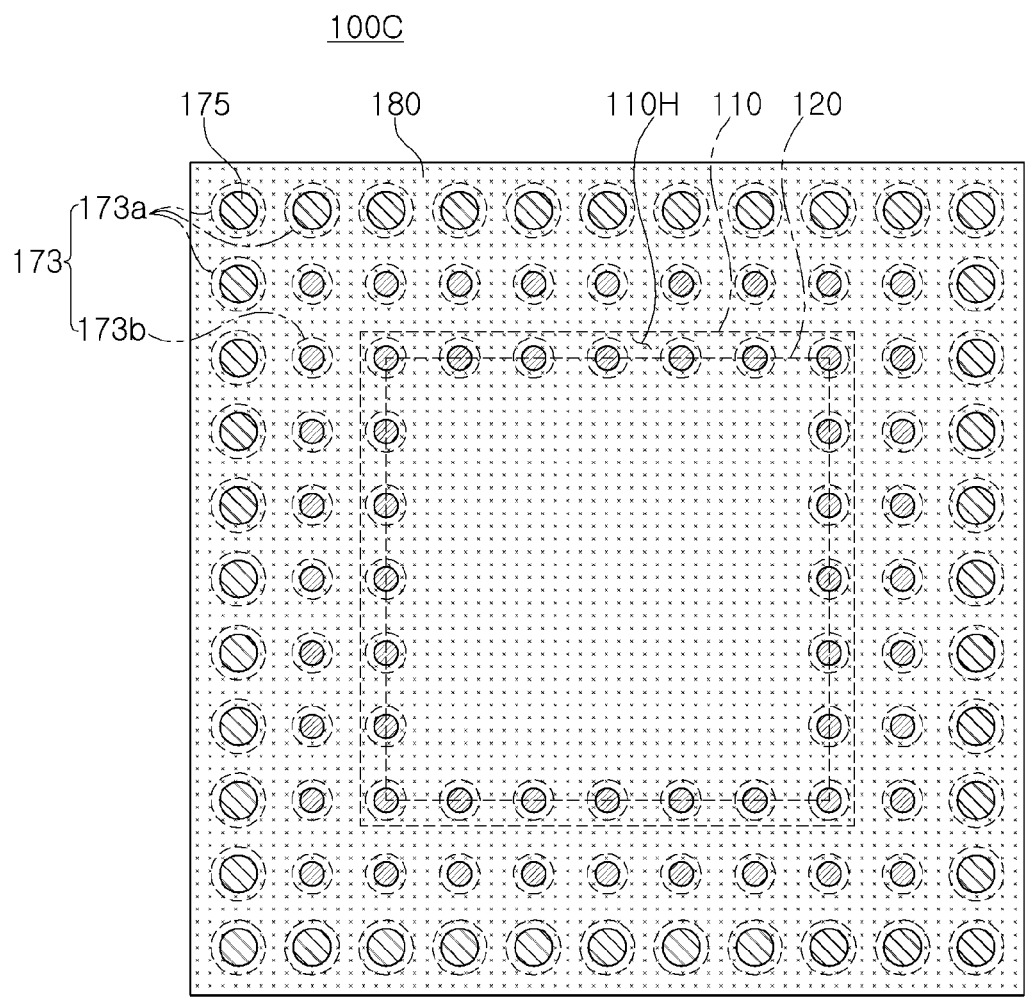
FIG. 5 is a schematic plan view of a semiconductor package according to example embodiments.

FIG. 5 is a schematic plan view of a semiconductor package according to example embodiments. FIG. 5 is a plan view as viewed from the top of a first semiconductor package 100C. In FIG. 5, like reference designators refer to like elements described above and repeated description thereof is omitted for conciseness.

Referring to FIG. 5, in the first semiconductor package 100C, upper pads 173 may include first upper pads 173a disposed along an edge of an upper surface of the first semiconductor package 100C, and second upper pads 173b disposed further inside than the first upper pads 173a. In the example embodiment illustrated in FIG. 5, unlike the first semiconductor package 100A of FIG. 1, the first upper pads 173a having a width relatively wider than that of the second upper pads 173b may be disposed on the entire edge rather than a portion of the edge.

Figure 6:
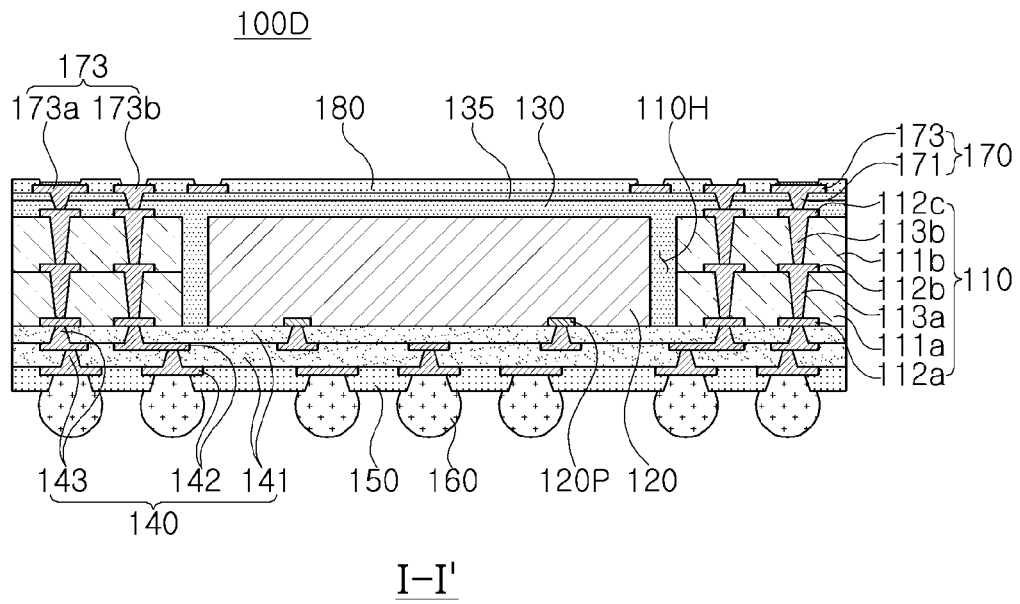
FIG. 6 is a schematic cross-sectional view of the semiconductor package of FIG. 5, according to example embodiments.

FIG. 6 is a schematic cross-sectional view of a semiconductor package according to example embodiments.

Referring to FIG. 6, in a first semiconductor package 100D, a second molded member 135 disposed on the first molded member 130 may be further included.

The second molded member 135 may be an insulating layer disposed on the back side of the semiconductor package 100D and on a side close to a surface (inactive surface) on which the connection electrode 120P of the semiconductor chip 120 is not disposed. The second molded member 135 may be connected to a portion of the upper pads 173 to cover the redistribution patterns in an area not illustrated. The second molded member 135 may surround the vertical wiring vias 171. The second passivation layer 180 may be disposed on the second molded member 135.

The second molded member 135 may include an insulating material, and as the insulating material, a material including an inorganic filler and an insulating resin, for example, a thermosetting resin such as an epoxy resin, a thermoplastic resin such as polyimide, or a resin in which these resins are mixed with a reinforcing material such as an inorganic filler, for example, ABF, FR-4, BT, resin, or the like may be used. In an example embodiment, as a material of the second molded member 135, a molding material such as EMC may be used, and a photosensitive material such as Photo Imageable Encapsulant (PIE) may be used. The second molded member 135 may be formed of the same material as the first molded member 130 or may be formed of a different material.

Figure 7:
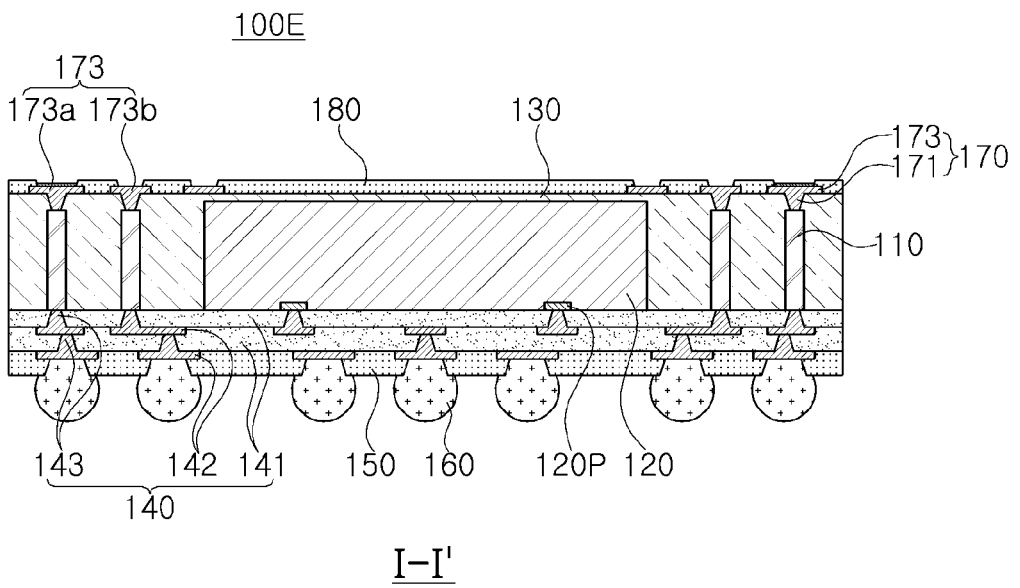
FIG. 7 is a schematic cross-sectional view of the semiconductor package of FIG. 5, according to example embodiments.

FIG. 7 is a schematic cross-sectional view of a semiconductor package according to example embodiments.

Referring to FIG. 7, in a semiconductor package 100E, a vertical connection structure 110 may be a conductive post disposed on one surface of the first package substrate 140, penetrating through at least a portion of the molding member 130 and electrically connecting the redistribution layer 142 and the upper pad 173. The vertical connection structure 110 may include a plurality of conductive posts disposed around (i.e., on sides of) the semiconductor chip 120. The conductive post may include a conductive material. The conductive post may be completely filled with a conductive material, and may have, for example, a cylindrical shape or a polygonal column shape. The shape of the conductive post is not particularly limited and may have various shapes.

It is noted that, components having the same reference numerals as in FIGS. 1 to 3B among the components illustrated in FIGS. 4A to 7 are similar in structure and function to the components illustrated in FIGS. 1 to 3B, and thus, repeated descriptions thereof have been be omitted for conciseness.

Figure 8:
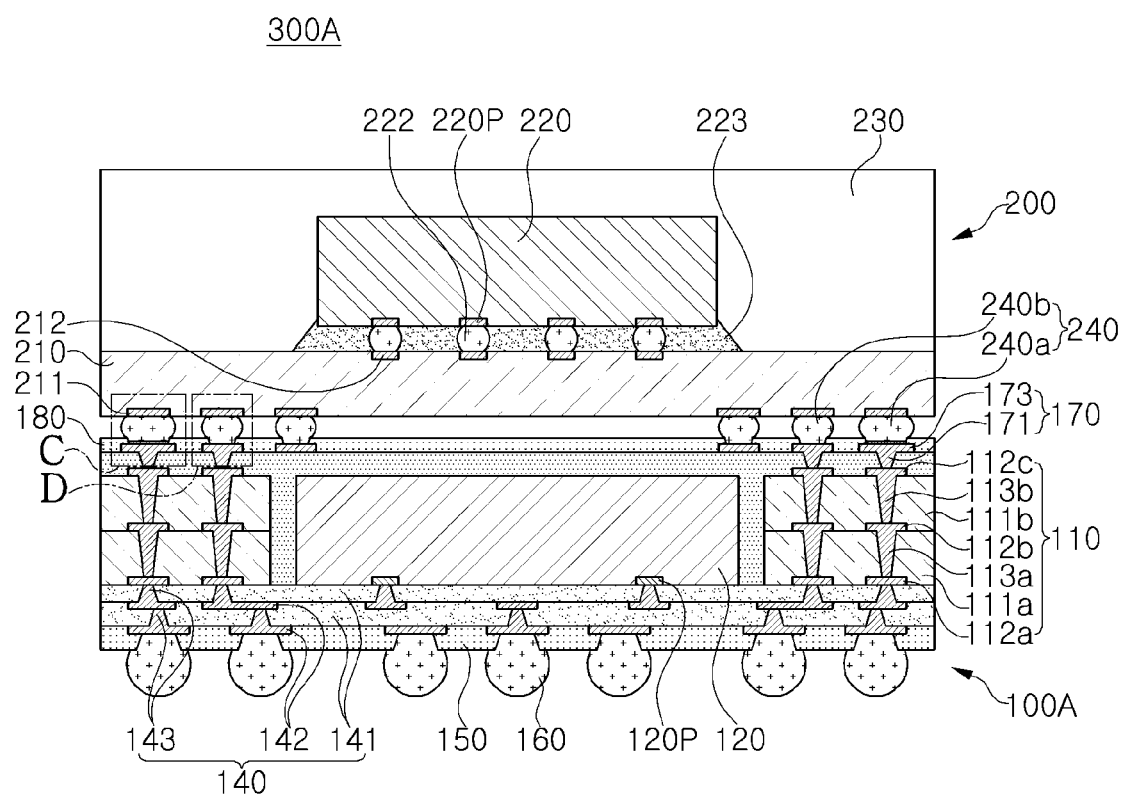
FIG. 8 is a schematic cross-sectional view of a package-on-package structure according to example embodiments.

FIG. 8 is a schematic cross-sectional view of a package-on-package structure according to example embodiments. FIG. 8 is a cross-sectional view illustrating an area taken along line I-I' of FIG. 1.

Figure 9A:
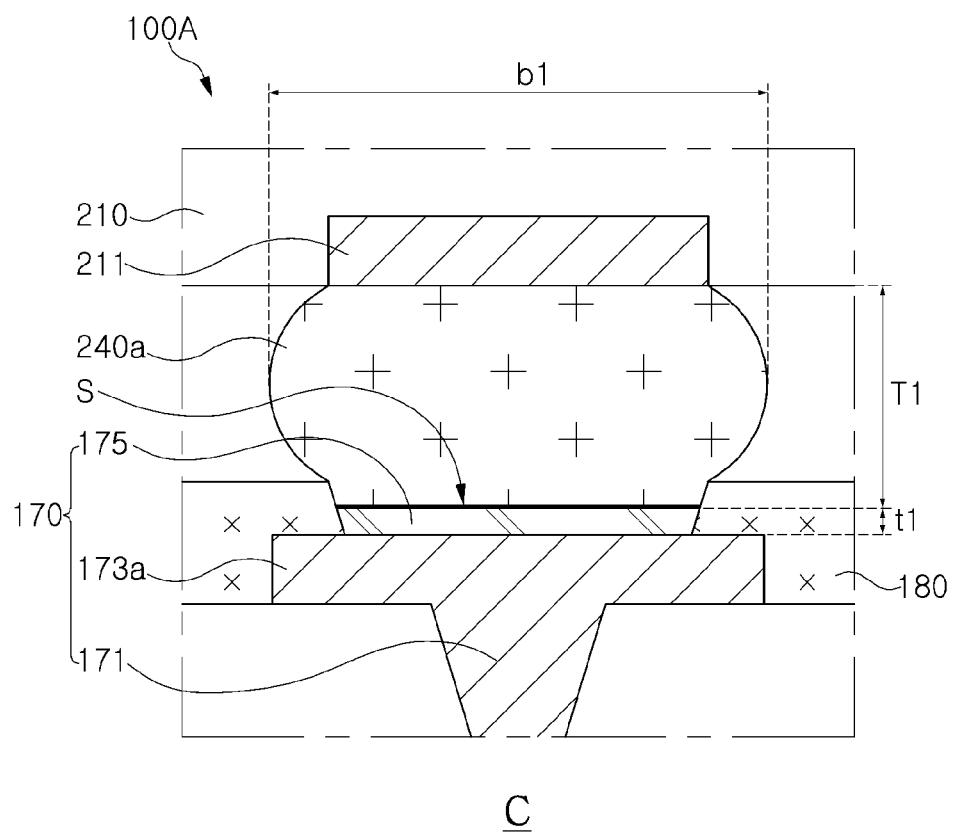
FIGS. 9A and 9B are schematic partially enlarged views of the package-on-package structure of FIG. 8, according to example embodiments.
Figure 9B:
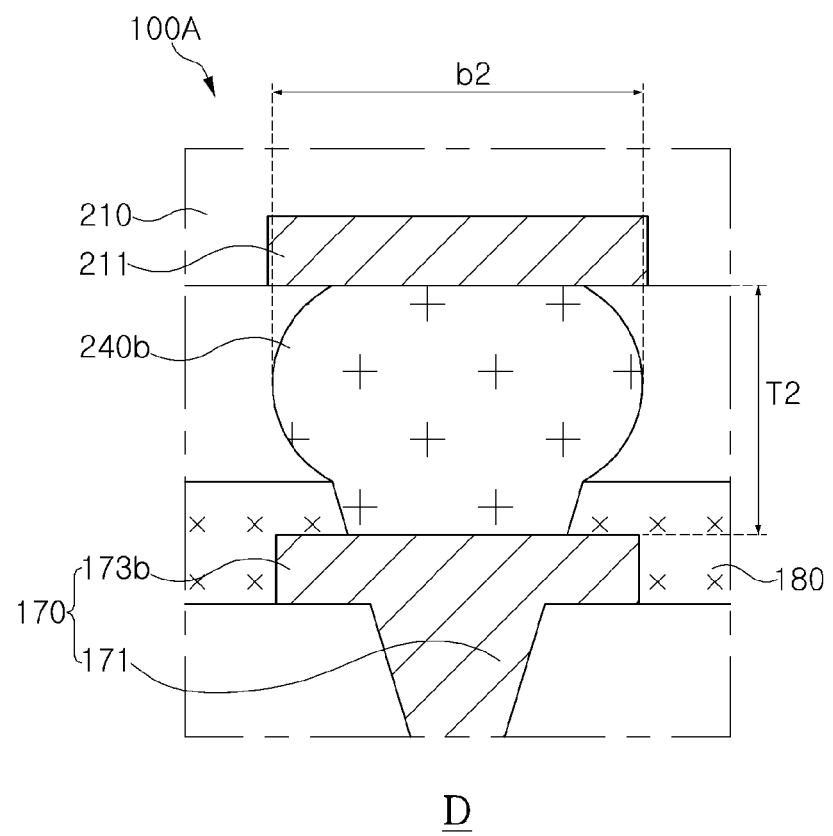

FIGS. 9A and 9B are partially enlarged views of the semiconductor package of FIG. 8, according to example embodiments. FIG. 9A is an enlarged view of area 'C' of FIG. 8. FIG. 9B is an enlarged view of area 'D' of FIG. 8.

Referring to FIGS. 8 to 9B, a semiconductor package 300A may include a second semiconductor package 200 combined with the first semiconductor package 100A described with reference to FIGS. 1 to 3B. In other example embodiments, the semiconductor packages 100B, 100C, 100D, and 100E according to the example embodiments of FIGS. 4A to 7 may be applied in FIG. 8 to a region corresponding to the first semiconductor package 100A.

In the semiconductor package 300A, the second semiconductor package 200 may include a second package substrate 210 including a plurality of lower pads 211, a second semiconductor chip 220, and an encapsulant 230. In addition, the semiconductor package 300A may include a plurality of connection bumps 240 electrically connecting the first semiconductor package 100A and the second semiconductor package 200. In some example embodiments, the second semiconductor package 200 may include the plurality of connection bumps 240. The semiconductor package 300A may further include a metal compound layer S disposed between the first connection bump 240a and the contact layer 175.

The second package substrate 210 may include lower redistribution pads 211 and upper redistribution pads 212, which may be electrically connected to components external to the second semiconductor substrate 210, on an upper surface and a lower surface thereof, respectively. The second package substrate 210 may include redistribution patterns connected to the redistribution pads 211 and 212 inside of the second package substrate 210. The redistribution patterns may redistribute a second connection electrode 220P of the second semiconductor chip 220 to the fan-out area.

The second semiconductor chip 220 may include second connection electrodes 220P, and the second connection electrodes 220P may be electrically connected to the second package substrate 210 by second metal bumps 222. In an example, the second semiconductor package 200 may further include an underfill material 223 surrounding the second metal bumps 222. The underfill material 223 may be an insulating material including an epoxy resin or the like. The second metal bump 222 may include a solder ball or a copper pillar.

Unlike illustrated in FIGS. 8-9B, in some example embodiments, the second connection electrodes 220P of the second semiconductor chip 220 may directly contact the upper surface of the second package substrate 210, and may be electrically connected to the redistribution patterns through internal vias.

The encapsulant 230 may include a material identical to or similar to the molded member 130 of the semiconductor package 100A.

The second semiconductor package 200 may be physically/electrically connected to the semiconductor package 100A by the connection bumps 240. The connection bumps 240 may be electrically connected to the redistribution patterns inside of the second package substrate 210 through the lower redistribution pads 211 on the lower surface of the second package substrate 210. Alternatively, the connection bumps 240 may be electrically connected to redistribution patterns inside of the second package substrate 210 through an under-bump metal disposed on the lower redistribution pads 211 on the lower surface of the second package substrate 210. Each of the connection bumps 240 may be formed of a low melting point metal, for example, tin (Sn) or an alloy including tin (Sn). In an example embodiment, the connection bump 240 may be formed of solder or the like, which is only an example, and thus, the material is not limited thereto.

The plurality of connection bumps 240 may electrically connect the plurality of upper pads 173 of the first semiconductor package 100A and the plurality of lower redistribution pads 211 of the second semiconductor package 200. The plurality of connection bumps 240 may include first connection bumps 240a adjacent to the corners of the upper surface of the wiring structure 170, and second connection bumps 240b closer to the center of the upper surface of the wiring structure 170 than the first connection bumps 240a. In some example embodiments, the first connection bumps 240a may be disposed at corners of the upper surface of the wiring structure 170, and the second connection bumps 240b may be between the first connection bumps 240a. The first connection bumps 240a may be disposed in a position corresponding to the first upper pads 173a, and the second connection bumps 240b may be disposed in a position corresponding to the second upper pads 173b. In other example embodiments, the first connection bumps 240a may be at least a portion of outermost connection bumps 240 arranged along the edge of the upper surface of the wiring structure 170, and the second connection bumps 240b may be disposed further inside than the first connection bumps 240a. The first connection bumps 240a may be disposed on the outermost sides of the wiring structure 170, and the second connection bumps 240b may be adjacent to the first connection bumps 240a. In some example embodiments, the first connection bumps 240a may be a portion of the outermost connection bumps arranged along the upper surface of the wiring structure 170 and the edge of the lower surface of the second package substrate 210, and the second connection bumps 240b may be connection bumps excluding the first connection bumps 240a, among the plurality of connection bumps 240.

The first connection bumps 240a may be disposed on the first upper pads 173a. The first connection bump 240a may be disposed on the contact layer 175, and may contact the contact layer 175. The first connection bump 240a may be disposed between the contact layer 175 and the lower redistribution pad 211. In an example embodiment, the connection bump 240 may be formed of the same material as the contact layer 175, but in other example embodiments may be formed of a different material. In an example embodiment, the connection bump 240 and the contact layer 175 may be formed of materials having different compositions. When the first connection bump 240a contacts the contact layer 175, a metal compound layer S may be formed between the first connection bump 240*a* and the contact layer 175. The metal compound layer (S) may be an inter metal compound (IMC).

The second connection bumps 240*b* may be disposed on the second upper pads 173*b*. The second connection bump 240*b* may contact the second upper pad 173*b*.

A first width b1, which is a maximum width of the first connection bump 240*a*, may be wider than a second width b2, which is a maximum width of the second connection bump 240*b*. In an example embodiment, the first width b1 of the first connection bump 240*a* may be about 5% to about 10% greater than the second width b2 of the second connection bump 240*b*. In an example embodiment, the first width b1 of the first connection bump 240*a* may be about 10 μm to about 40 μm wider than the second width b2 of the second connection bump 240*b*. In an example embodiment, the first width b1 of the first connection bump 240*a* may range from about 220 μm to about 240 μm. In an example embodiment, the second width b2 of the second connection bump 240*b* may range from about 200 μm to about 220 μm.

A first thickness T1 of the first connection bump 240*a* on a first package substrate 140 in a vertical direction may be less than a second thickness T2 of the second connection bump 240*b*. In an example embodiment, a thickness t1 of the contact layer 175 may be substantially identical to the difference between the first thickness T1 of the first connection bump 240*a* and the second thickness T2 of the second connection bump 240*b*. Since the contact layer 175 is disposed below the first connection bump 240*a*, a difference in heights between the first connection bump 240*a* and the second connection bump 240*b* may be compensated for. The contact layer 175 is not disposed on the second connection bump 240*b*. The contact layer 175 is disposed only on the first upper pad 173*a* on which the first connection bump 240*a* is disposed, and thus, distances between the upper surface of the wiring structure 170 and the second package substrate 210 may be substantially the same in the outermost area and the inner area. According to an example embodiment, in a package-on-package structure, the connection distances between the first semiconductor package 100A and the second semiconductor package 200 by the connection bump 240 may be substantially the same.

Referring to FIGS. 4A and 4B together, when the first semiconductor package 100B is applied to the lower package, the first connection bump 240*a* may be disposed on the contact layer 175 and may contact the contact layer 175, and the second connection bump 240*b* may be disposed on the barrier layer 174 and may contact the barrier layer 174.

It is noted that components having the same reference numerals as in FIGS. 2 to 3B among the components illustrated in FIGS. 8 to 9B, are similar in structure and function to the components illustrated in FIGS. 2 to 3B, and thus, repeated descriptions thereof will be omitted for conciseness.

Figure 10:
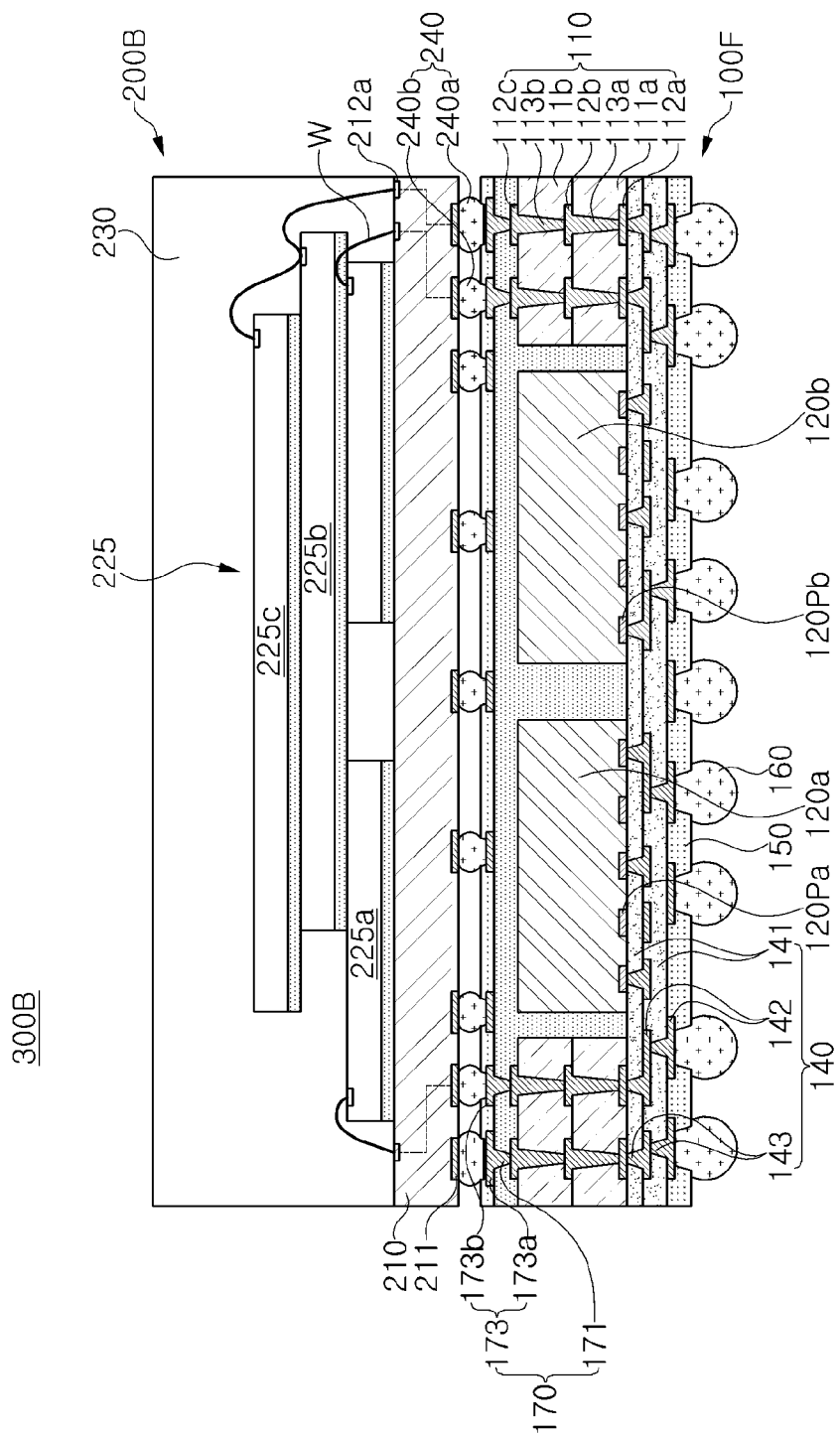
FIG. 10 is a schematic cross-sectional view of a semiconductor package according to example embodiments.

FIG. 10 is a schematic cross-sectional view of a semiconductor package according to example embodiments.

Referring to FIG. 10, in a semiconductor package 300B having a package-on-package structure, a first semiconductor package 100F may include a plurality of semiconductor chips 120*a* and 120*b*, and a second semiconductor package 200B may include a semiconductor stacked structure 225, and conductive wires W electrically connecting the semiconductor stacked structure 225 to upper and lower redistribution pads 211 and 212*a* of a second package substrate 210. The semiconductor stacked structure 225 may include a plurality of semiconductor chips 225*a*, 225*b*, and 225*c* sequentially stacked.

Each of the plurality of semiconductor chips 120*a* and 120*b* may have an active surface on which connection pads 120Pa and 120Pb are disposed, respectively, and an inactive surface opposite to the active surface. The first semiconductor chip 120*a* and the second semiconductor chip 120*b* of the first semiconductor package 100F may include an integrated circuit (IC) in which hundreds to millions of devices are integrated. For example, each of the first semiconductor chip 120*a* and the second semiconductor chip 120*b* may be a power management integrated circuit (PMIC) or an Application Processor (AP) chip such as a central processor (e.g., CPU), a graphic processor (e.g., GPU), a digital signal processor, an encryption processor, a microprocessor, a microcontroller or the lie, or a volatile memory (e.g., DRAM) chip, non-volatile memory (e.g., ROM) chip, flash memory chip, or a logic chip, etc.

It is noted that components having the same reference numerals in FIGS. 2 to 3B among the components illustrated in FIG. 10 are similar in structure and function to the components illustrated in FIGS. 2 to 3B, and thus, repeated descriptions thereof will be omitted for conciseness.

As set forth above, according to various example embodiments, when a package on package (POP) of a semiconductor package is applied, connection reliability between a lower package and an upper package may be improved.

While various example embodiments have been illustrated and described above, it will be apparent to those skilled in the art that modifications and variations could be made without departing from the scope of the present inventive concept as defined by the appended claims.

What is claimed is:

1. A semiconductor package comprising:
   a first semiconductor package including:
      a first package substrate including a redistribution layer,
      a first semiconductor chip disposed on the first package substrate and electrically connected to the redistribution layer,
      a molded member disposed on the first package substrate and covering the first package substrate and the first semiconductor chip,
      a wiring structure disposed on the molded member and having an upper surface on which a plurality of upper pads are arranged, and
      a frame disposed between the first package substrate and the wiring structure, having a through-hole in which the first semiconductor chip is disposed, the frame electrically connecting the redistribution layer and the plurality of upper pads;
   a second semiconductor package disposed on the first semiconductor package, and including:
      a second package substrate having a lower surface on which a plurality of lower redistribution pads are arranged, and
      a second semiconductor chip disposed on the second package substrate and electrically connected to the plurality of lower redistribution pads; and
   a plurality of connection bumps electrically connecting the plurality of upper pads and the plurality of lower redistribution pads,
   wherein upper pads among the plurality of upper pads that are formed vertically under the second semiconductor package include a first upper pad adjacent to a corner of the upper surface of the wiring structure, and a second upper pad closer to a center of the upper surface of the wiring structure than the first upper pad, the plurality of connection bumps include a first connection bump disposed in a position corresponding to the first upper pad and a second connection bump disposed in a position corresponding to the second upper pad,
a first width of the first upper pad is wider than a second width of the second upper pad,
a maximum width of the first connection bump is wider than a maximum width of the second connection bump,
a maximum thickness of the first connection bump in a vertical direction is less than a maximum thickness of the second connection bump in the vertical direction, and
the wiring structure further includes a contact layer disposed on the first upper pad between the first upper pad and the first connection bump.

2. The semiconductor package of claim 1, wherein the first connection bump is in contact with the contact layer, and
the second connection bump is in contact with the second upper pad.

3. The semiconductor package of claim 1, further comprising an intermetallic compound (IMC) layer between the first connection bump and the contact layer.

4. The semiconductor package of claim 1, wherein the first width of the first upper pad is about 5% to about 10% wider than the second width of the second upper pad.

5. The semiconductor package of claim 1, wherein the first width of the first upper pad ranges from about 250 μm to about 270 μm, and the second width of the second upper pad ranges from about 230 μm to about 250 μm.

6. The semiconductor package of claim 1, wherein the maximum width of the first connection bump is in a range of about 220 μm to about 240 μm, and the maximum width of the second connection bump is in a range of about 200 μm to about 220 μm.

7. The semiconductor package of claim 1, wherein a first thickness of the first connection bump in a vertical direction on the first package substrate is less than a second thickness of the second connection bump in the vertical direction.

8. The semiconductor package of claim 7, wherein a thickness of the contact layer in the vertical direction is substantially the same as a difference between the first thickness of the first connection bump and the second thickness of the second connection bump.

9. The semiconductor package of claim 1, wherein a thickness of the contact layer in a vertical direction on the first package substrate is in a range of about 5 μm to about 15 μm.

10. The semiconductor package of claim 1, further comprising a passivation layer disposed on the molded member and having a plurality of openings at least partially exposing a region of each of the plurality of upper pads.

11. The semiconductor package of claim 10, wherein the plurality of openings include a first opening at least partially exposing a region of the first upper pad, and a second opening at least partially exposing a region of the second upper pad, and
an average width of the first opening is wider than an average width of the second opening.

12. The semiconductor package of claim 11, wherein the contact layer is disposed in the first opening, and an upper surface of the contact layer is disposed lower than an upper surface of the passivation layer.

13. The semiconductor package of claim 11, wherein a width of a lowermost portion of the first opening is in a range of about 225 μm to about 245 μm, and a width of a lowermost portion of the second opening is in a range of about 205 μm to about 220 μm, and
a width of an uppermost portion of the first opening is in a range of about 240 μm to about 260 μm, and a width of an uppermost portion of the second opening is in a range of about 220 μm to about 240 μm.

14. The semiconductor package of claim 1,
wherein the frame includes:
a first insulating layer in contact with the first package substrate,
a first wiring layer in contact with the first package substrate and buried in the first insulating layer,
a second wiring layer disposed on a side opposite to a side of the first insulating layer in which the first wiring layer is buried,
a second insulating layer disposed on the first insulating layer and covering the second wiring layer, and
a third wiring layer disposed on a side opposite to a side of the second insulating layer in which the second wiring layer is buried; and
wherein the first wiring layer, the second wiring layer and the third wiring layer are electrically connected to the redistribution layer.

15. A semiconductor package comprising:
a first semiconductor package;
a second semiconductor package disposed on the first semiconductor package; and
a plurality of connection bumps electrically connecting the first semiconductor package and the second semiconductor package,
wherein the first semiconductor package includes:
a first package substrate including a redistribution layer,
a first semiconductor chip disposed on the first package substrate and electrically connected to the redistribution layer,
a wiring structure disposed on the first semiconductor chip and having an upper surface on which a plurality of upper pads are arranged, and
a vertical connection structure disposed on the first package substrate and electrically connecting the redistribution layer and the plurality of upper pads,
the second semiconductor package includes:
a second package substrate having a lower surface on which a plurality of lower redistribution pads are arranged, and
a second semiconductor chip disposed on the second semiconductor package and electrically connected to the plurality of lower redistribution pads,
each of the plurality of connection bumps are formed directly below corresponding ones of the plurality of lower redistribution pads,
upper pads among the plurality of upper pads that are formed vertically under the second semiconductor package include a first upper pad adjacent to a corner of the upper surface of the wiring structure, and a second upper pad closer to a center of the upper surface of the wiring structure than the first upper pad,
the plurality of connection bumps include a first connection bump disposed in a position corresponding to the first upper pad and a second connection bump disposed in a position corresponding to the second upper pad,
connection bumps among the plurality of connection bumps that are formed vertically under the second semiconductor package include the first connection bump that is at least a portion of outermost connection bumps arranged along edges of the wiring structure and the second package substrate and that is disposed in a position corresponding to the first upper pad, and the second connection bump, other than the first connection bump that is disposed in a position corresponding to the second upper pad, and a maximum thickness of the first connection bump in a vertical direction on the wiring structure is less than a maximum thickness of the second connection bump in the vertical direction.

16. The semiconductor package of claim 15, wherein the first connection bump is a connection bump disposed on a corner among the outermost connection bumps arranged along edges of the wiring structure.

17. The semiconductor package of claim 15, wherein the second connection bump contacts a portion of the plurality of upper pads, and the wiring structure further includes a contact layer, disposed below the first connection bump while being in contact with the first connection bump, the contact layer having a third thickness, wherein the third thickness is substantially the same as a difference between the first thickness of the first connection bump and the second thickness of the second connection bump.

\* \* \* \* \*